United States Patent [19]
Okabe et al.

[11] Patent Number: 6,107,661
[45] Date of Patent: Aug. 22, 2000

[54] SEMICONDUCTOR DEVICE AND METHOD OF MANUFACTURING SAME

[75] Inventors: Naoto Okabe, Chita-gun; Tsuyoshi Yamamoto, Kariya, both of Japan

[73] Assignee: Nippondenso Co., Ltd., Kariya, Japan

[21] Appl. No.: 08/720,018

[22] Filed: Sep. 27, 1996

[30]   Foreign Application Priority Data

Sep. 29, 1995 [JP] Japan .................................... 7-253747
Sep. 29, 1995 [JP] Japan .................................... 7-253748
Jul. 19, 1996 [JP] Japan .................................... 7-190454

[51] Int. Cl.$^7$ ......................... H01L 21/336; H01L 29/76
[52] U.S. Cl. ......................... 257/330; 257/331; 257/332; 257/341; 257/390
[58] Field of Search .................... 257/330–332, 257/341, 390, 401

[56]   References Cited

U.S. PATENT DOCUMENTS

| | | | |
|---|---|---|---|
| 4,941,026 | 7/1990 | Temple ................... | 357/24.3 |
| 5,072,266 | 12/1991 | Bulucea et al. ........... | 357/23.4 |
| 5,698,880 | 12/1997 | Takahashi et al. ........ | 257/330 |
| 5,714,781 | 2/1998 | Yamamoto et al. ........ | 257/329 |
| 5,747,851 | 5/1998 | Tomatsu et al. .......... | 257/330 |
| 5,776,812 | 7/1998 | Takahashi et al. ........ | 438/268 |
| 5,780,324 | 7/1998 | Tokura et al. ............ | 438/138 |

FOREIGN PATENT DOCUMENTS

| | | |
|---|---|---|
| 335750 | 10/1989 | European Pat. Off. . |
| 0 550 770 A1 | 7/1993 | European Pat. Off. . |
| 0 666 590 A2 | 9/1995 | European Pat. Off. . |
| 3427293 A1 | 2/1985 | Germany . |
| 64-39069 | 2/1989 | Japan . |
| 2-154468 | 6/1990 | Japan . |

OTHER PUBLICATIONS

Tokura et al., Production method of vertical type MOSFET, USPending Application, Aug. 15, 1995.
Okabe et al., Semiconductor device in which defects due to LOCOS or heat treatment are suppressed, US Pending Application, Apr. 26, 1996.
Okabe et al, Manufacturing method of semiconductor device, US Pending Application, Jul. 3, 1996.
Katoh K et al: "Design of new structural high breakdown voltage V–MOSFET–static shield V–MOSFET", Electronics and Communications in Japan, Jun. 1983, USA, vol. 66, NR. 6, pp. 95–105, ISSN 0424–8368 XP002063904 * p. 96, colonne 1:figure 3.
Tokura N et al: "Concave–DMOSFET:A New Super–Low On–Resistance Power MOSFET", fevrier 1995, Japanese Journal of Applied Physics, vol. 34, NR. 2B, Part 01, pp. 903–908 XP000599415 * p. 903–p. 904.

*Primary Examiner*—Leo P. Picard
*Assistant Examiner*—Hung Van Duong
*Attorney, Agent, or Firm*—Pillsbury Madison Sutro LLP

[57]   ABSTRACT

A concave channel type DMOS structure having an improved gate-to-source breakdown voltage are disclosed. By establishing a curvature at a corner portion of a lattice-like pattern in a groove portion for forming the concave channel structure, the shape of the tip of a three-dimensionally projecting portion of a semiconductor region determined by a plane angle of the corner portion in the lattice-like pattern and an inclination of the groove portion is rounded. That is, a three-dimensionally sharpened corner portion in the concave channel structure is rounded, and thereby electric field concentration at the corner portion is suppressed.

11 Claims, 15 Drawing Sheets

SEMICONDUCTOR DEVICE AND METHOD OF MANUFACTURING SAME

CROSS REFERENCE TO RELATED APPLICATION

This application is based upon and claims the benefit of priority of the prior Japanese Patent Application Nos. (Hei) 7-253747 filed on Sep. 29, 1995 and (Hei) 7-253748 filed on Sep. 29, 1995, incorporated herein by reference.

BACKGROUND OF THE INVENTION

1. Field of the Invention

The present invention relates to a semiconductor device suitably employed for a MOS-IC etc. as a single unit or with the incorporation of a power semiconductor device.

2. Related Arts

Recently, a vertical type power MOSFET has been used in many industrial fields for various features thereof such as high frequency characteristics, fast switching speed and low power driving.

As a conventional vertical type power MOSFET, there have been disclosed concave channel type DMOS structures in International Publication No. PCT WO93/03502 and the Japanese Unexamined Patent Publication No. 62-12167, for example. The proposed DMOS structure has a concave structure or a bathtub-shaped groove structure fabricated by a combination of local oxidation of silicon (LOCOS) technique and chemically etching off the formed thick oxide film (so-called LOCOS oxide film), which obtains the elimination of JFET resistance by means of the concave configuration thereof.

Furthermore, both publications disclose a formation of an initial groove which is conducted by means of wet etching and prior to the formation of the above-mentioned thick oxide film by means of LOCOS technique. The formation of the initial groove can improve productivity of the concave channel type DMOS structure. That is to say, if the concave configuration, the side surface of which becomes the channel part, is formed by LOCOS technique alone, the LOCOS oxidation time period would lengthen, and the angle of the groove side surface would be as gentle as approximately 30°, which would make it impossible to micronize cells and the reduction in the ON-resistance would not be promising. Furthermore, if the concave configuration is formed by the LOCOS technique alone, as the volume of Si almost doubles due to oxidation by nature, the channel part might be residually strained by the increase in the Si volume. Therefore, the etching process prior to the LOCOS oxidation, i.e., the initial groove formation process, is necessary by all means.

SUMMARY OF THE INVENTION

However, the semiconductor device proposed in the above-mentioned publication, as illustrated in FIGS. 22A and 22B, uses a square-patterned FET cell. Accordingly, the concave structure, in which a gate insulating film and a gate electrode are buried, is provided as a groove configuration which has a lattice-like pattern and is spread over the device surface. Due to this groove configuration, a three-dimensionally sharpened structure is associated on the semiconductor surface at a corner portion of the groove. In such a structure, since the electric field is easily concentrated at the above-mentioned three-dimensionally sharpened portion when voltage is applied between the gate electrode and the semiconductor surface (e.g., a source region), it is likely to have a lowering of gate-to-source breakdown voltage.

In view of the above problems, it is a primary object of the present invention to obtain a semiconductor device which having an improved gate-to-source breakdown voltage.

According to the present invention, as a channel region formed on a semiconductor surface is set along with a groove shape, the ON-resistance becomes extremely lowered. In addition, a curvature at each corner portion, appeared in a plane pattern of the groove, is established to round the shape of the tip of a three-dimensionally projecting portion of a semiconductor region which is determined by an angle of the corner portion and the inclination of the groove. Consequently, according to the structure where a gate insulating film (e.g., silicon dioxide) is disposed on the semiconductor region and a gate electrode is disposed on the gate insulating film, when voltage is applied between the gate electrode and a source region, the concentration of the electric field at the above-mentioned three-dimensionally projecting portion is reduced and occurrence of failure in characteristic of the gate-to-source breakdown voltage is suppressed.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

A first embodiment of the present invention will now be described with reference to the accompanying drawings.

Figure 1A:
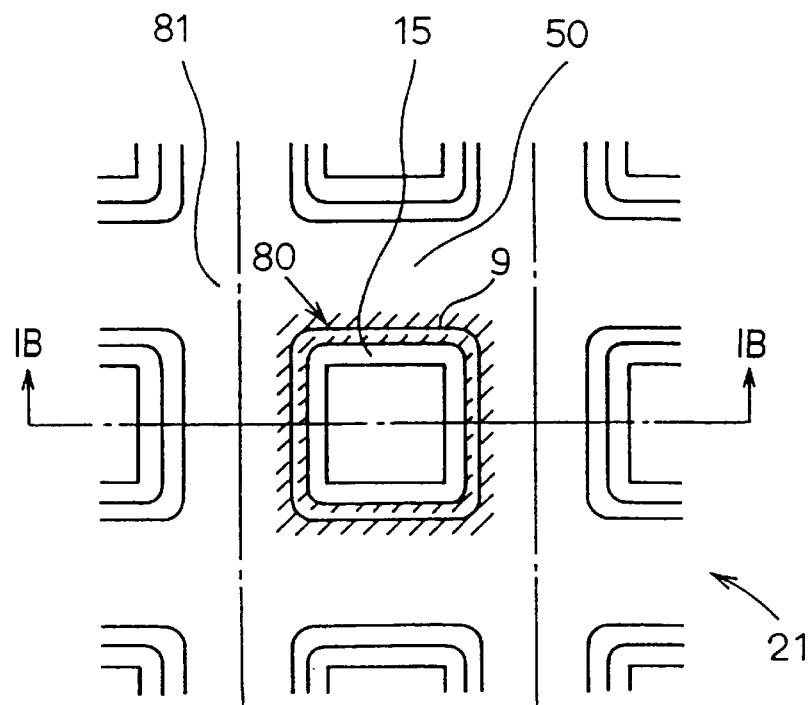
FIG. 1A is a plan view illustrating a part of a vertical type power MOSFET of a first embodiment according to the present invention.
Figure 1B:
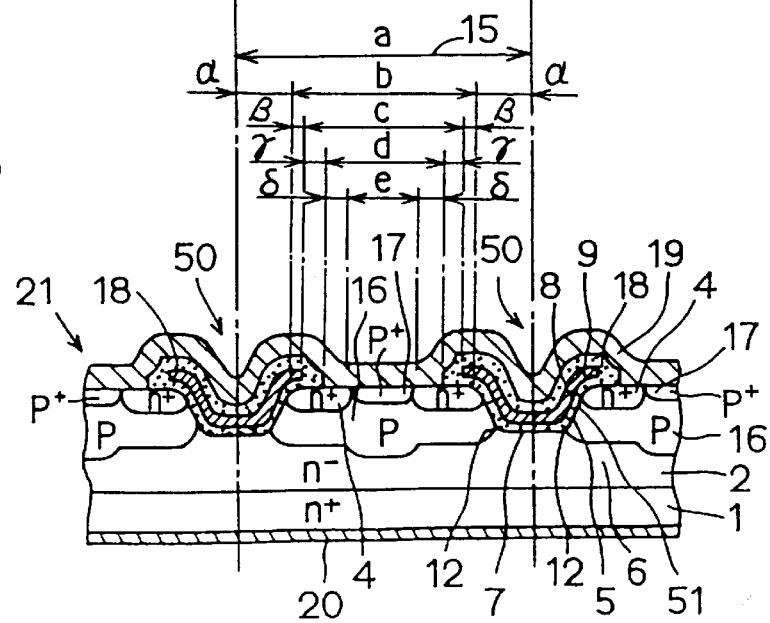
FIG. 1B is a cross-sectional view taken along line IB—IB of FIG. 1A.

FIG. 1A is a plan view of a vertical type power MOSFET composed of numerous square unit cells according to the present invention, and FIG. 1B is a cross-sectional view taken along line IB—IB of FIG. 1A. FIGS. 2 through 21 are descriptive views of the respective stages of the manufacturing method for the vertical type power MOSFET.

The main part (unit cell part) of the vertical type power MOSFET according to this embodiment is so constructed (i.e., a lattice pattern) as illustrated in FIGS. 1A and 1B in which numerous unit cells 15 are laid out lengthwise and breadthwise at a pitch (unit cell dimension) of a.

In FIG. 1A, a wafer 21 is composed of a semiconductor substrate 1 comprising an n$^+$-type silicon to an impurity concentration of about $10^{19} \sim 10^{20}$ cm$^{-3}$ and a thickness of 100–300 µm and an n$^-$-type epitaxial layer 2 formed to an impurity concentration of about $10^{16}$ cm$^3$ and a thickness of around 5–20 µm (7 µm, for example) on semiconductor substrate 1, and numerous unit cells 15 are regularly laid out on the main surface of wafer 21. To form a U-groove (i.e., concave structure) 50 at a pitch of the unit cell dimension a (=approximately 12 µm), on the main surface of wafer 21 is formed a LOCOS oxide film to a thickness of approximately 1 µm, and then, by performing a double diffusion using the LOCOS oxide film as a double diffusion mask, a p-type body region 16 to a junction depth of approximately 2 µm and on n$^+$-type source region 4 to a junction depth of approximately 0.5 µm are disposed self-aligningly with U-groove (concavity) 50 created by an erosion due to the formation of the LOCOS oxide film, with the result that a channel 5 is defined. After the double diffusion, the LOCOS oxide film, which is used for forming U-groove 50 as well as for the diffusion mask, is removed, a gate oxide film 8 is formed to a thickness of approximately 60 nm on the inner wall of U-groove 50 and on gate oxide film 8 are formed a gate electrode 9 with polysilicon to a thickness of approximately 400 nm and an interlayer insulating film 18 with borophosphosilicate glass (BPSG) to a thickness of approximately 1 µm. Furthermore, ohmic contact is made between a source electrode 19 formed on interlayer insulating film 18 and n$^+$-type source region 4 and a p$^+$-type body contact region 17 through a contact hole. On the other hand, a drain electrode 20 is formed commonly on the back surface of semiconductor substrate 1 to make ohmic contact therewith.

A manufacturing method of the first embodiment will now be described.

Figure 2:
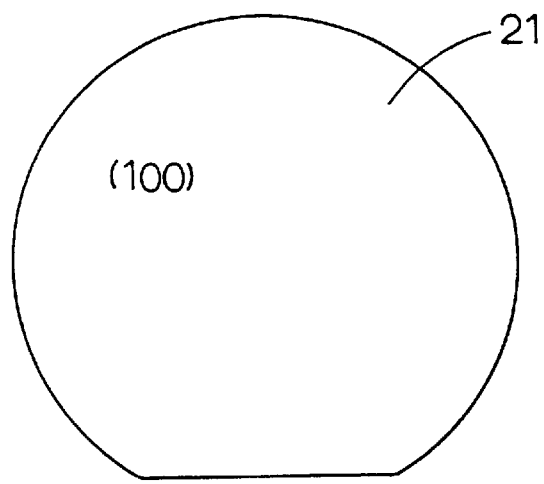
FIG. 2 is a plan view utilized for an explanation of a manufacturing process of the vertical type power MOSFET of the first embodiment according to the present invention.
Figure 3:
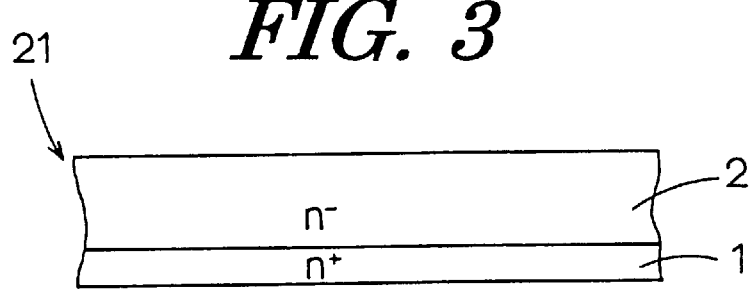
FIG. 3 is a cross-sectional view utilized for the explanation of the manufacturing process of the vertical type power MOSFET of the first embodiment.
Figure 4:
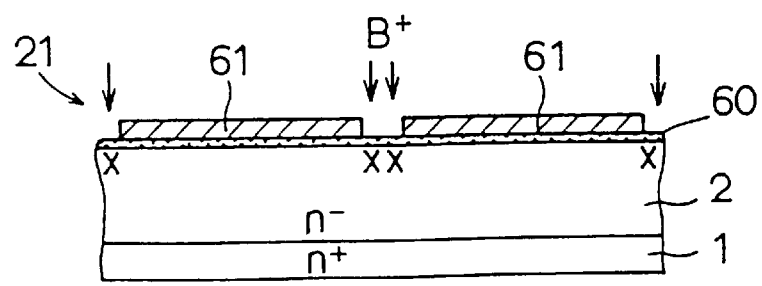
FIG. 4 is a cross-sectional view utilized for the explanation of the manufacturing process of the vertical type power MOSFET of the first embodiment.

First of all, as illustrated in FIGS. 2 and 3, wafer 21 in which an n$^-$-type epitaxial layer 2 is formed by means of homo-epitaxial growth on the main surface of the (100)-oriented n$^+$-type silicon substrate 1 is prepared. The impurity concentration of n$^+$-type silicon substrate 1 is approximately $10^{19}$–$10^{20}$ cm$^{-3}$, and the thickness of epitaxial layer 2 is approximately 5–20 µm and the impurity concentration thereof is approximately $10^{15}$~$10^{16}$ cm$^{-3}$. As shown in FIG. 4, a pad oxide film 60 of a thickness of approximately 60 nm and a field oxide film (not shown) are formed by thermally oxidizing the main surface of wafer 21 and subsequently a photoresist film 61 is deposited and patterned to form a pattern opened in the central part of a region where a cell is to be formed by means of well-known photolithographic techniques. Then, boron ions (B$^+$) are implanted into epitaxial layer 2 by using photoresist film 61 as a mask.

Figure 5:
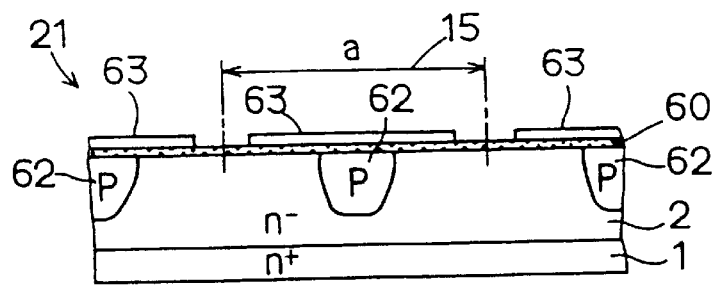
FIG. 5 is a cross-sectional view, taken along line V—V of FIG. 6A, utilized for the explanation of the manufacturing process of the vertical type power MOSFET of the first embodiment.

As illustrated in FIG. 5, after removing photoresist film 61, a p-type diffusion region (deep p-well region) 62 is formed to a junction depth of approximately 3 µm by means of thermal diffusion. This p-type diffusion region 62 ultimately constitutes a part of p-type body region 16 (described later) and plays a role of improving the surge resistance of the device by stably causing a breakdown at the bottom part of p-type diffusion region 62 when a high voltage is applied to between the drain electrode and the source electrode.

Furthermore, as illustrated in FIG. 5, a silicon nitride film 63 is deposited to a thickness of approximately 200 nm on the main surface of wafer 21. Then as illustrated in the plan view of FIG. 6A (FIG. 5 shows a cross-section along line V—V in FIG. 6A), silicon nitride film 63 is patterned to be vertical and parallel to an orientation of <011> to form a lattice-like open pattern at a pitch of a (dimension of unit cell 15). The open pattern is a pattern in which each corner portion 63A is curved (rounded).

Figure 7:
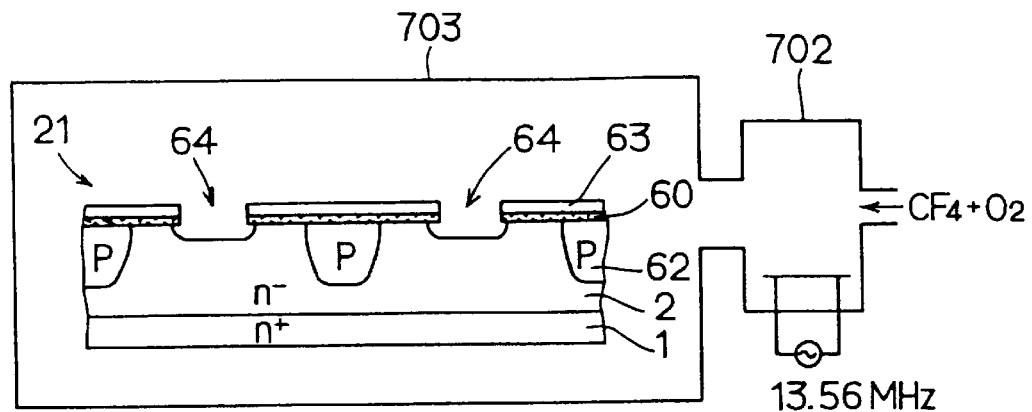
FIG. 7 is a schematic view utilized for the explanation of the manufacturing process of the vertical type power MOSFET of the first embodiment.

Then, pad oxide film 60 is etched using silicon nitride film 63 as a mask. Following this, as illustrated in FIG. 7, a chemical dry etching (CDE) is performed on resultant wafer 21. That is to say, chemically active species are made by generating plasma within a discharge chamber 702 into which carbon tetrafluaride and oxygen gases are supplied, the active species are transported into a reaction chamber 703, and an initial groove 64 is isotropically formed by chemically dry-etching n$^-$-type epitaxial layer 2 within reaction chamber 703.

Figure 8:
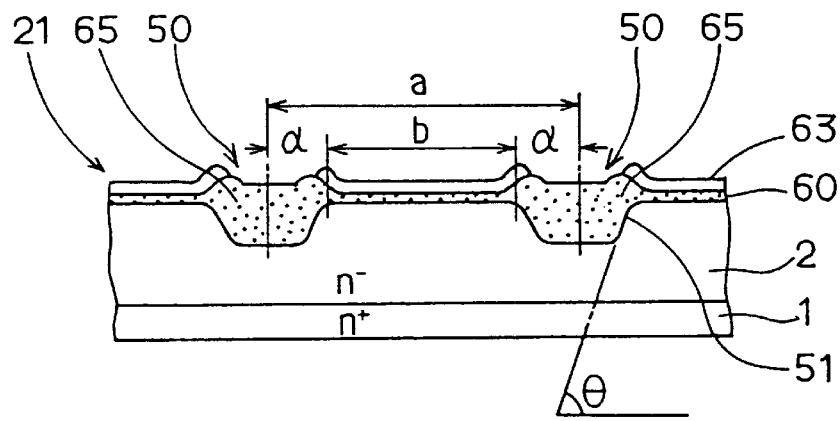
FIG. 8 is a cross-sectional view utilized for the explanation of the manufacturing process of the vertical type power MOSFET of the first embodiment.

Next, as illustrated in FIG. 8, the part of groove 64 is thermally oxidized using silicon nitride film 63 as an oxidation mask. This is an oxidation method well known as LOCOS (local oxidation of silicon) method. By this oxidation, a LOCOS oxide film 65 is formed on the surface of wafer 21 so as to have the lattice-like surface pattern shape, and concurrently the shape of a U-groove 50 (concave structure), i.e., bathtub-shaped groove structure, is defined by erosion of the surface of n$^-$-type epitaxial layer 2 due to the growth or LOCOS oxide film 65.

In the above process, the conditions of chemical dry etching and LOCOS oxidation are selected to control an elevation angle θ of the sidewall of the U-groove 50 (FIG. 8), with the result that the index of plane of the channel forming part on the sidewall surface of U-groove 50 can be approximately (111). A result of computing the relationship between the depth of the initial groove 64 and the angle formed by the sidewall of the groove 50 after the LOCOS oxidation and the main surface of the substrate is described in ISPSD'93, pp 135–140. According to this result, the angle between the sidewall of the groove 50 and the main surface of tho substrate is controlled by changing the etching depth obtained by the chemical dry etching and the time of LOCOS oxidation.

Inside wall surface of U-groove 50 formed by the LOCOS oxidation as described above has a high flatness and few defects, and the surface condition thereof is as good as the main surface of wafer 21 in the initial stage illustrated in FIG. 2.

Figure 9:
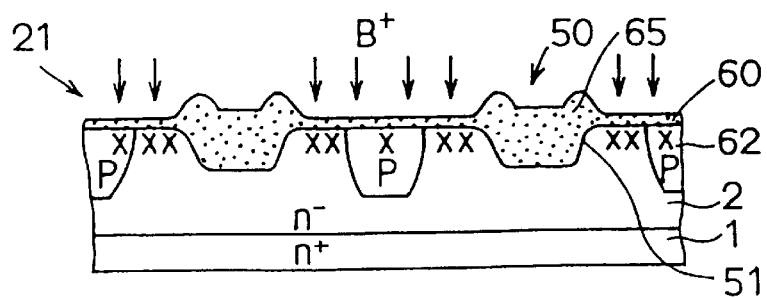
FIG. 9 is a cross-sectional view utilized for the explanation of the manufacturing process of the vertical type power MOSFET of the first embodiment.

Then, as illustrated in FIG. 9, boron ions are implanted through thin pad oxide film 60 using LOCOS oxide film 65 as a diffusion mask. At this time, the boundary part between LOCOS oxide film 65 and pad oxide film 60 constitutes a self-alignment position to exactly define a region into which boron ions are implanted.

Figure 10:
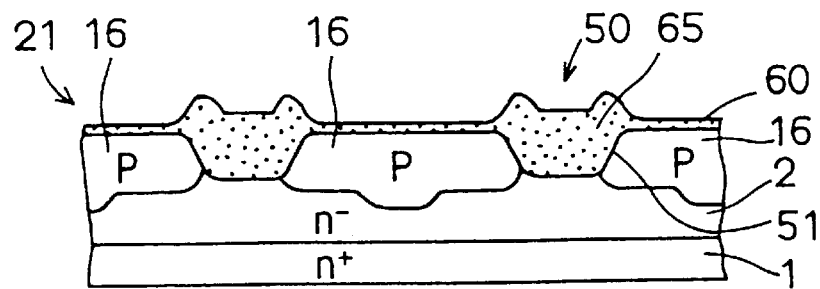
FIG. 10 is a cross-sectional view utilized for the explanation of the manufacturing process of the vertical type power MOSFET of the first embodiment.

Then, as illustrated in FIG. 10, thermal diffusion is applied to diffuse the implanted boron ions into epitaxial layer 2 to a junction depth of approximately 3 μm. As the result of this thermal diffusion, p-type diffusion region 62 previously formed in the process illustrated in FIG. 5 and the boron diffusion region (channel p-well region) into which boron ions have been implanted in the process illustrated in FIG. 9 are integrated into a composite p-type region (i.e., p-type body region) 16, both ends of which are self-aligned and defined by the positions of the sidewalls of U-groove 50.

Figure 11:
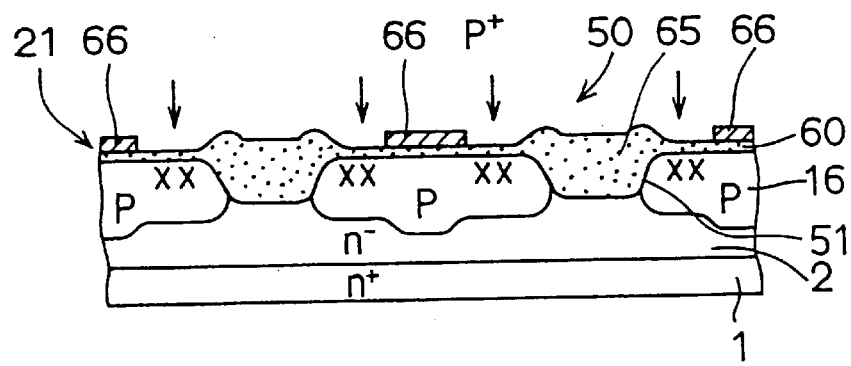
FIG. 11 is a cross-sectional view utilized for the explanation of the manufacturing process of the vertical type power MOSFET of the first embodiment.

Subsequently, as illustrated in FIG. 11, after forming a photoresist film 66 which is patterned so as to cover the central part of the surface of p-type body region 16 surrounded by LOCOS oxide film 65 formed on the main surface of wafer 21 in the lattice-like pattern, phosphorous (or arsenic) ions are implanted through thin pad oxide film 60 using photoresist film 66 and LOCOS oxide film 65 as a diffusion mask. In this process, as in the process illustrated in FIG. 9 in which boron ions have been implanted, the boundary part between LOCOS oxide film 65 and pad oxide film 60 constitutes a self-alignment position, whereby the ion implantation region can exactly be defined.

Figure 12:
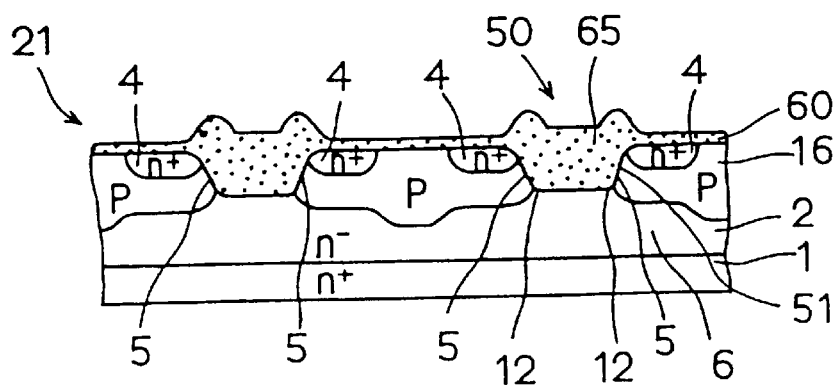
FIG. 12 is a cross-sectional view utilized for the explanation of the manufacturing process of the vertical type power MOSFET of the first embodiment.

The next process is, as illustrated in FIG. 12, to apply thermal diffusion to form an n$^+$-type source region 4 of approximately 0.5–1 μm in junction depth and define channel 5 as well. The end surface being in contact with U-groove 50 in the region or n$^+$-type source region 4 is self-aligned and defined in the position of the sidewall of U-groove 50.

The process illustrated in FIGS. 9 to 12 fix the junction depth and shape of p-type body region 115. Here, a point is that the shape of p-type body region 16 is perfectly symmetric with respect to U-groove 50 due to the self-alignment and thermal diffusion.

Figure 13:
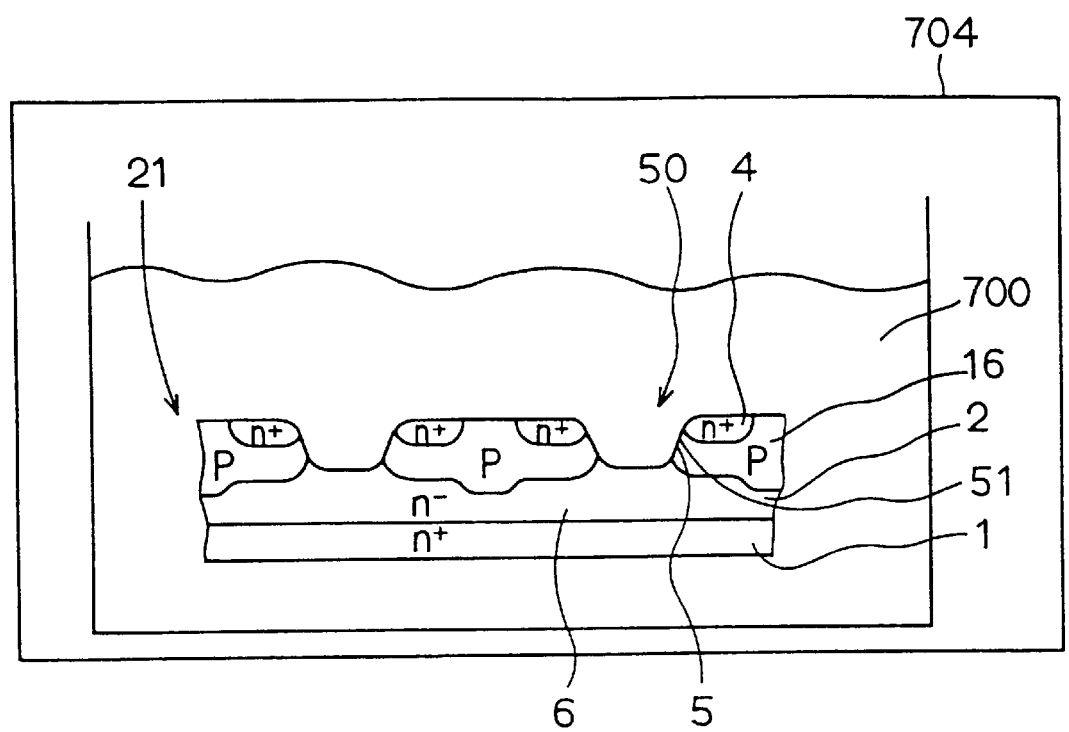
FIG. 13 is a schematic view utilized for the explanation of the manufacturing process of the vertical type power MOSFET of the first embodiment.

Next, as illustrated in FIG. 13, an inside wall 51 of U-groove 50 is exposed by removing LOCOS oxide film 65 while terminating the exposed silicon surface with hydrogen within an aqueous solution 700 containing hydrofluoric acid.

After the completion of the above process, wafer 21 is taken out from the aqueous solution 704 and dried in a clean air.

Figure 14:
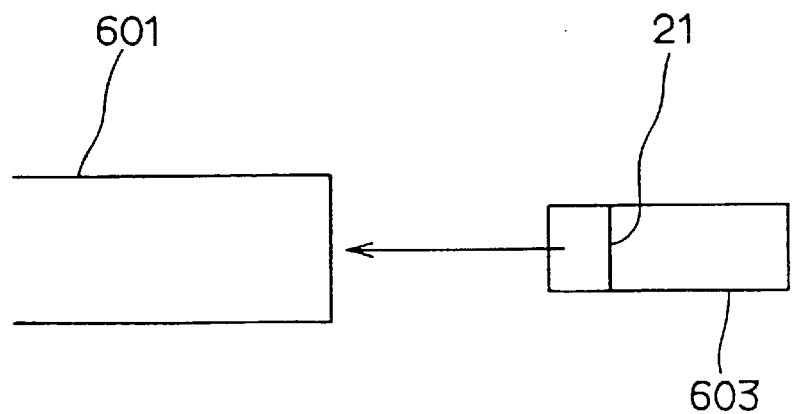
FIG. 14 is a schematic view utilized for the explanation of the manufacturing process of the vertical type power MOSFET of the first embodiment.
Figure 15:
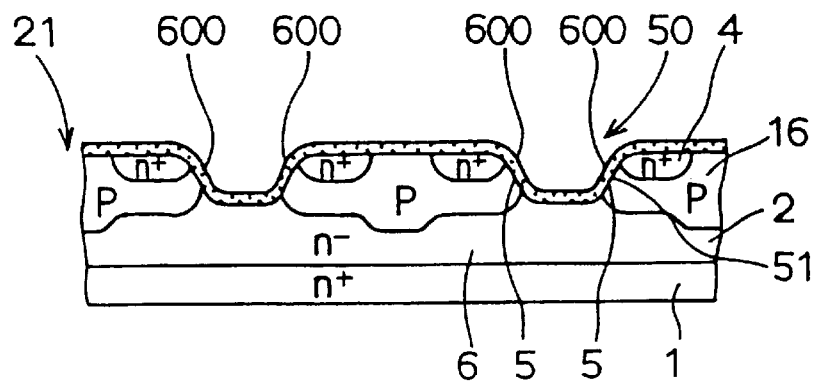
FIG. 15 is a cross-sectional view utilized for the explanation of the manufacturing process of the vertical type power MOSFET of the first embodiment.
Figure 16:
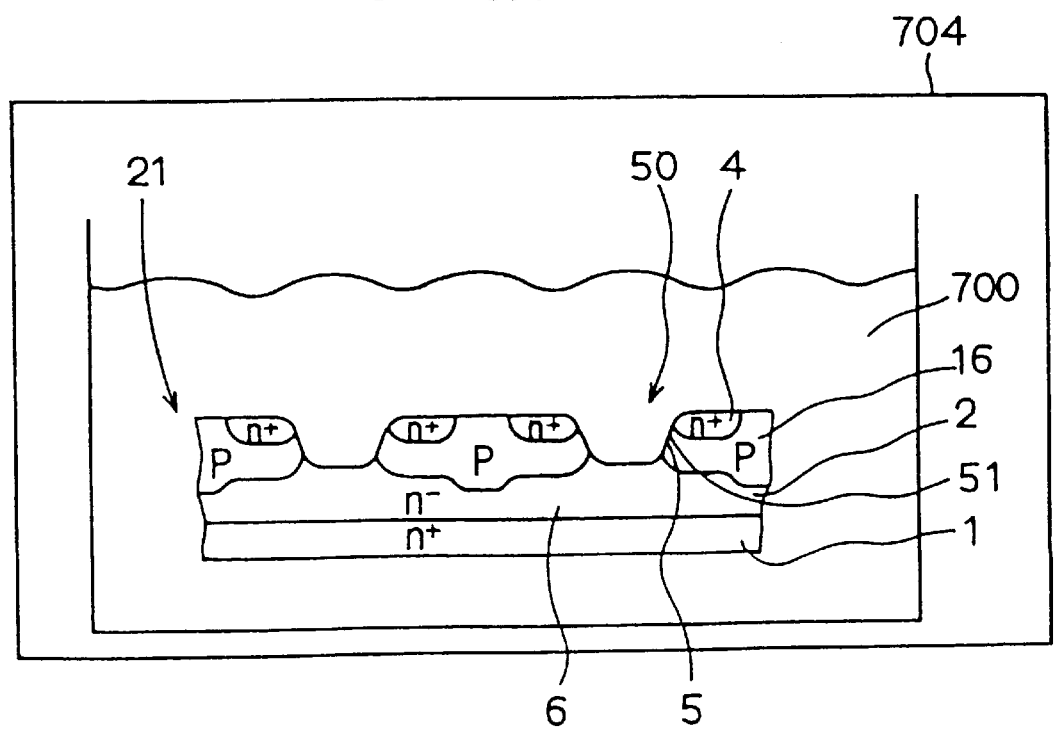
FIG. 16 is a schematic view utilized for the explanation of the manufacturing process of the vertical type power MOSFET of the first embodiment.

Then, as illustrated in FIG. 15, a temporary oxide film 600 is formed on the sidewall surface 51 of U-groove 50 (i.e., the surface of p-type body region 16 where channel 5 is to be formed). By this thermal oxidation process, the flatness of the surface where channel 5 is to be formed is improved in terms of atomic order. As illustrated in FIG. 14, this thermal oxidation process is performed by slowly inserting a quartz wafer boat 603 holding wafer 21 into an oxidation furnace 601 which is maintained within the oxygen atmosphere at a temperature of approximately 1,000° C. Then, the thus formed oxide film 600 is removed as illustrated in FIG. 16. As well as the removal of local oxide film 65 described above, the removal of oxide film 600 is also performed while terminating the exposed silicon surface with hydrogen within an aqueous solution 700 containing hydrofluoric acid and adjusted to an acidity/alkalinity of around pH5 with ammonium fluoride. Inside wall surface 51 of U-groove 50 formed by this method is a good silicon surface with a high flatness and few defects.

Figure 17A:
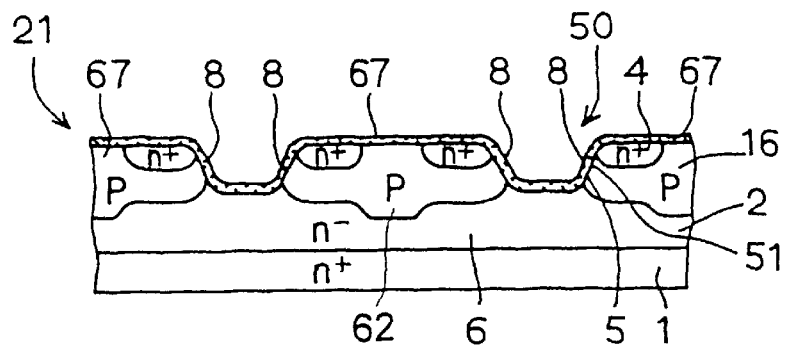
FIG. 17A is a cross-sectional view utilized for the explanation of the manufacturing process of the vertical type power MOSFET of the first embodiment.

As illustrated in FIG. 17A, a gate oxide film 8 is then formed to a thickness of approximately 60 nm on the sidewall surface and bottom wall surface of U-groove 50 by thermal oxidation.

This thermal oxidation process is, as described above and as illustrated in FIG. 14, performed by slowly inserting wafer 21 into an oxidation furnace 601 which is maintained within the oxygen atmosphere at a temperature of approximately 1,000° C. In this thermal oxidation process, as the initial stage of the oxidation is performed at a comparatively low temperature, the scattering of impurities within p-type body region 16 and n$^+$-type source region 4 to the outside of wafer 21 during the thermal oxidation process can be suppressed. The film quality and thickness uniformity of gate oxide film 8, the interface state density of the interface where channel 5 is formed and the carrier mobility are as high as those of the conventional planar type DMOSFET.

Figure 17B:
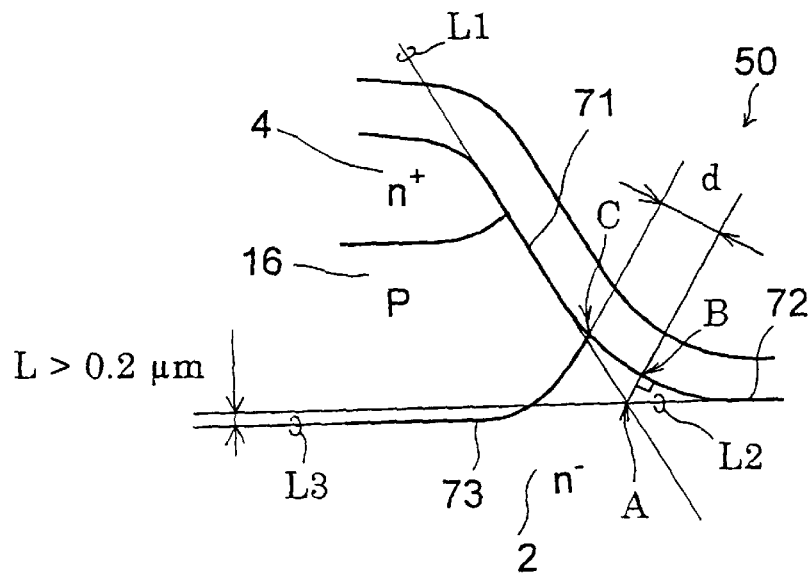
FIG. 17B is an enlarged cross-sectional view of FIG. 17A, illustrating the relationship between the concave dimension and the channel well region.

Further, in the above processes, the position of the bottom of U-groove 50, which is defined by chemical dry etching method, LOCOS oxidation process and gate oxidation process, is controlled such that the depth from the main surface to an interface 72 between gate oxide film 8 and silicon (an interface which is disposed at the bottom of U-groove 50 and is substantially in parallel with the silicon main surface) is set to be 0.2 μm or more shallower than the junction depth of the channel p-well region (i.e., a pn-junction 73 between p-type body region 16 and n⁻-type epitaxial layer 2, which is substantially in parallel with the main surface and is adjacent to U-groove 50). FIG. 17B, which is an enlarged view around the channel formation part, shows the relationship between the depth of interface 72 at the groove bottom (a tangential line L2) and the bottom of pn-junction 73 (a tangential line L3). Further, as illustrated in FIG. 17B, assuming that: a point A is defined as an intersection point of a line L1 tangential to an interface 71 between the gate oxide film and silicon at the sidewall of U-groove 50 and line L2 tangential to interface 72 at the bottom of U-groove 50; a point B is defined as an intersection point of perpendiculars from point A to the inner wall of U-groove 50; and a point C is defined as a terminating point where the p-type body region 16 terminates at the sidewall of U-groove 50 and p-type body region 16 and the gate oxide film is in contact with each other inside of groove 50, the point B is set to be deeper than the point C. Herein, since the position of interface 72 at the U-groove bottom is set by processes of chemical dry etching, LOCOS oxidation and gate oxidation, all of which are dry precesses, the controllability of the position of interface 72 is extremely high, and the positional relationship among the terminating point C, interface 72 and the bottom 73 of the channel p-well region is readily controlled with accuracy. (An oxide film removing process is performed by wet process, but practically the groove depth is determined by the above-mentioned three dry processes because the etch selectivity of the removed oxide film to silicon is high.)

Figure 18:
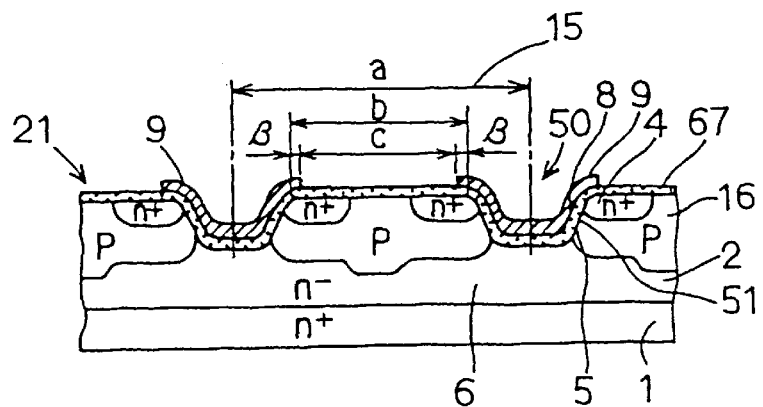
FIG. 18 is a cross-sectional view utilized for the explanation of the manufacturing process of the vertical type power MOSFET of the first embodiment.
Figure 19:
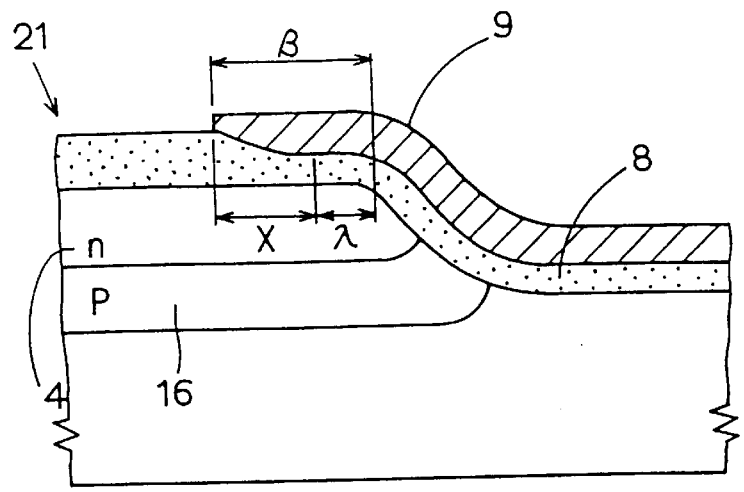
FIG. 19 is an enlarged cross-sectional view illustrating the relationship between the concavity and the insulated gate structure of the vertical type power MOSFET of the first embodiment.

Then, as illustrated in FIG. 18, gate electrode 9 is formed by depositing a polysilicon film on the main surface of wafer 21 to a thickness of approximately 400 nm and patterning the deposited polysilicon film so as to be separated by a distance c which is shorter by 2β than a distance b between the inlet corners of two U-grooves 50 adjacent to each other. Then, gate oxide film 8 is further oxidized (a thick film part is formed) so as to be thicker at the end part of gate electrode 9. Here, when the length of a part where gate oxide film 8 is thickened is χ as illustrated in FIG. 19, the above mentioned β is set to be longer than χ (β>χ).

The processes illustrated in FIGS. 9 through 18 are important stages of the manufacturing process according to the embodied basic structure, in which p-type body region 16, n⁺-type source region 4 and channel 5 are formed by using LOCOS oxide film 65 as a double diffusion mask for self-alignment, then LOCOS oxide film 65 is removed and gate oxide film 8 and gate electrode 9 are formed.

Figure 20:
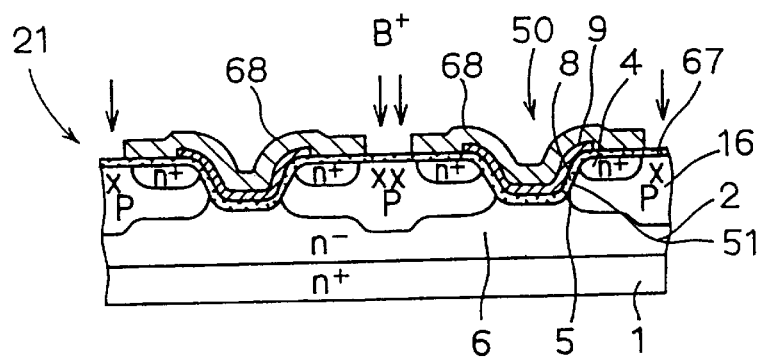
FIG. 20 is a cross-sectional view utilized for the explanation of the manufacturing process of the vertical type power MOSFET of the first embodiment.

Then, as illustrated in FIG. 20, boron ions are implanted through a surface oxide film 67 using a patterned photoresist film 68 as a mask to form a p⁺-type body contact region.

Figure 21:
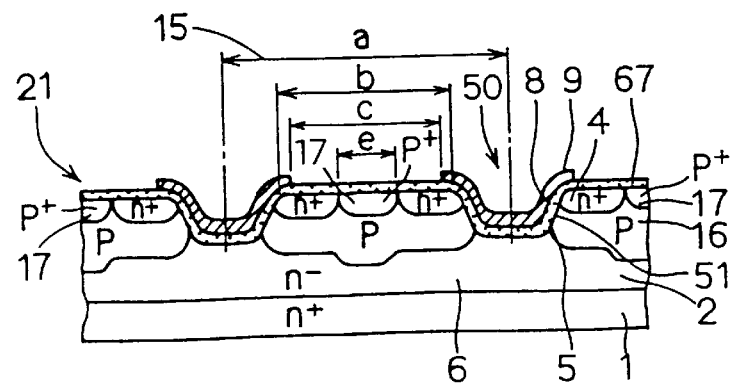
FIG. 21 is a cross-sectional view utilized for the explanation of the manufacturing process of the vertical type power MOSFET of the first embodiment.
Figure 22A:
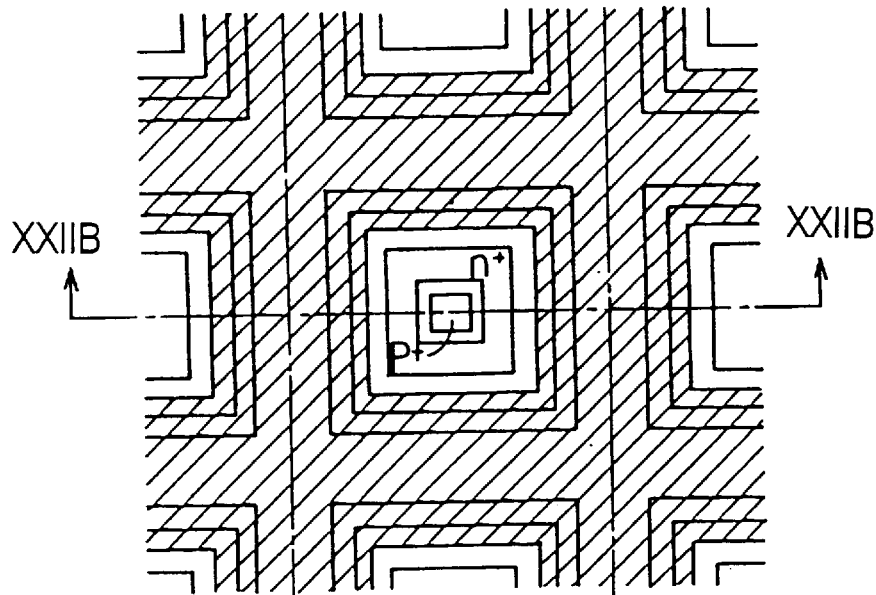
FIG. 22A is a plan view illustrating a part of a conventional vertical type power MOSFET.
Figure 22B:
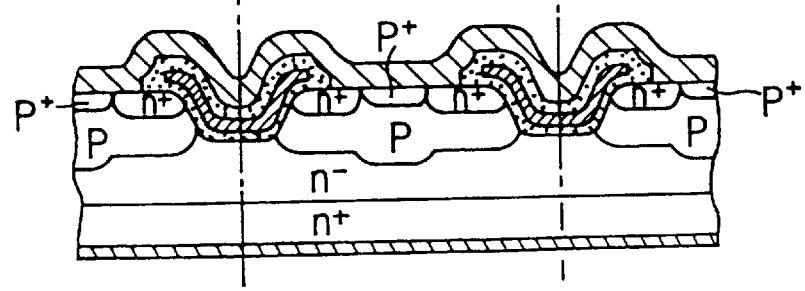
FIG. 22B is a cross-sectional view taken along line XXIIB—XXIIB of FIG. 22A.

Then, as illustrated in FIG. 21, to apply thermal diffusion is applied to form a p⁺-type body contact region 17 of approximately 0.5 μm in junction depth.

Next, as illustrated in FIG. 1B, interlayer insulating film 18 is formed with BPSG on the main surface of wafer 21 and contact holes are made in parts of interlayer insulating film 18 to expose p⁺-type body contact region 17 and n⁺-type source region 4 through the contact hole. Furthermore, source electrode 19 is formed with an aluminum film so that ohmic contact is made with n⁺-type source region 4 and p⁺-type body contact region 17 through the contact hole. Subsequently, a passivation film (not illustrated) is formed with silicon nitride, etc., for protecting the aluminum film by a plasma enhanced CVD (chemical vapor deposition) technique or the like. On the back surface of wafer 21 is formed drain electrode 20 with three layers of a Ti film, a Ni film and a Au film, an ohmic contact is made between drain electrode 20 and n⁺-type semiconductor substrate 1.

Figure 6A:
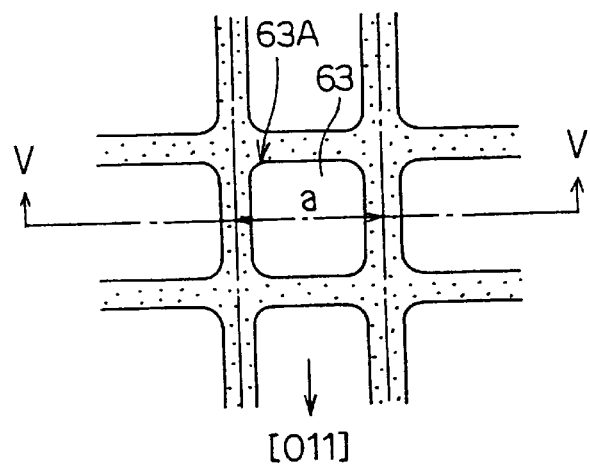
FIGS. 6A and 6B are plan views utilized for the explanation of the manufacturing process of the vertical type power MOSFET of the first embodiment and a second embodiment, respectively.

Next, effects of the present embodiment will be described. As illustrated in FIG. 6A, the plane pattern of silicon nitride film 63, deposited on the main surface of wafer 21, has its each corner portion 63A curved. Accordingly, since the etched region, i.e., initial groove 64 illustrated in FIG. 7, is patterned using silicon nitride film 63 as an etching mask, the etched region has the same plane pattern with the curvature at each corner portion thereof. Furthermore, corner portions of oxide film 65 after the LOCOS oxidation (FIG. 8) is also patterned in the same plane pattern with the curvature. This plane pattern is reflected in a corner pattern of the square cell in the last process. For this reason, a corner portion 60 of the square cell is patterned with the curvature as illustrated in FIG. 1A showing the structure of the last process, thereby rounding the shape at the tip of three-dimensionally projecting portion of semiconductor region (4, 16) which is defined by the angle of the corner portion of the lattice-like pattern and the angle of inclination of the groove sidewall. Consequently, according to the structure where a gate insulating film 8 (e.g., silicon dioxide) is disposed with respect to semiconductor region (4, 16) and gate electrode 9 is further disposed on gate insulating film 8, when voltage is applied between the gate electrode and the source electrode, the concentration of the electric field at the above-mentioned three-dimensionally projecting portion is reduced and occurrence of failure in characteristic of the gate-to-source breakdown voltage is suppressed.

Further, according to the present embodiment, the initial groove 64 is formed by the chemical dry etching method, and after that, a groove portion 50 is formed by widening the initial groove 64 by the LOCOS oxidation and removing the LOCOS oxide film 65. Since the thus formed groove portion 50 is used as a channel region, the groove portion 50 provides extremely low ON-resistance.

Here, as for the above-mentioned curvature established on the corner portion 80 of U-groove 50, it has been already found that as the concave depth of U-groove 50, i.e., the distance between the bottom of gate oxide film 8 and the main surface of the n⁻-type epitaxial layer 2, is deeper, the radius of curvature should be larger. This will be explained with reference to FIGS. 24 and 25.

Figure 24:
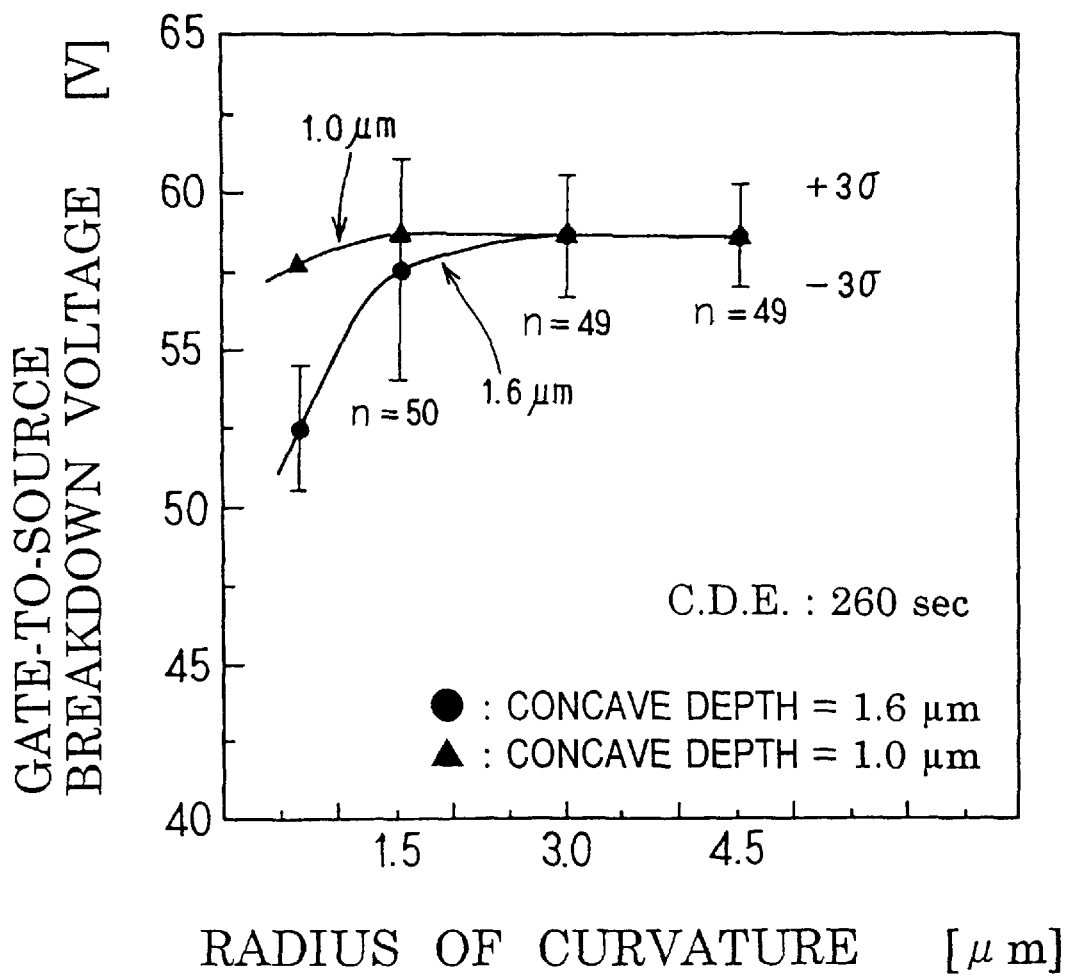
FIG. 24 is a graph illustrating the relationship between a radius of curvature at a groove corner and a gate-to-source breakdown voltage.

FIG. 24 is a graph showing the relationship between the radius of curvature at corner portion 80 of U-groove 50 and the gate-to-source breakdown voltage (TZDB). In the graph, a circle-marked plot (●) is a datum at the concave depth of 1.6 μm and a triangle-marked plot (▲) is a datum at the concave depth of 1.0 μm. As can be seen from the graph, as the radius of curvature becomes smaller, the gate-to-source breakdown voltage becomes smaller in both cases. In addition, the high breakdown voltage can be maintained when the radius of curvature with the concave depth of 1.6 μm and 1.0 μm become equal to or more than 1.5 μm and 0.5 μm, respectively.

Figure 25:
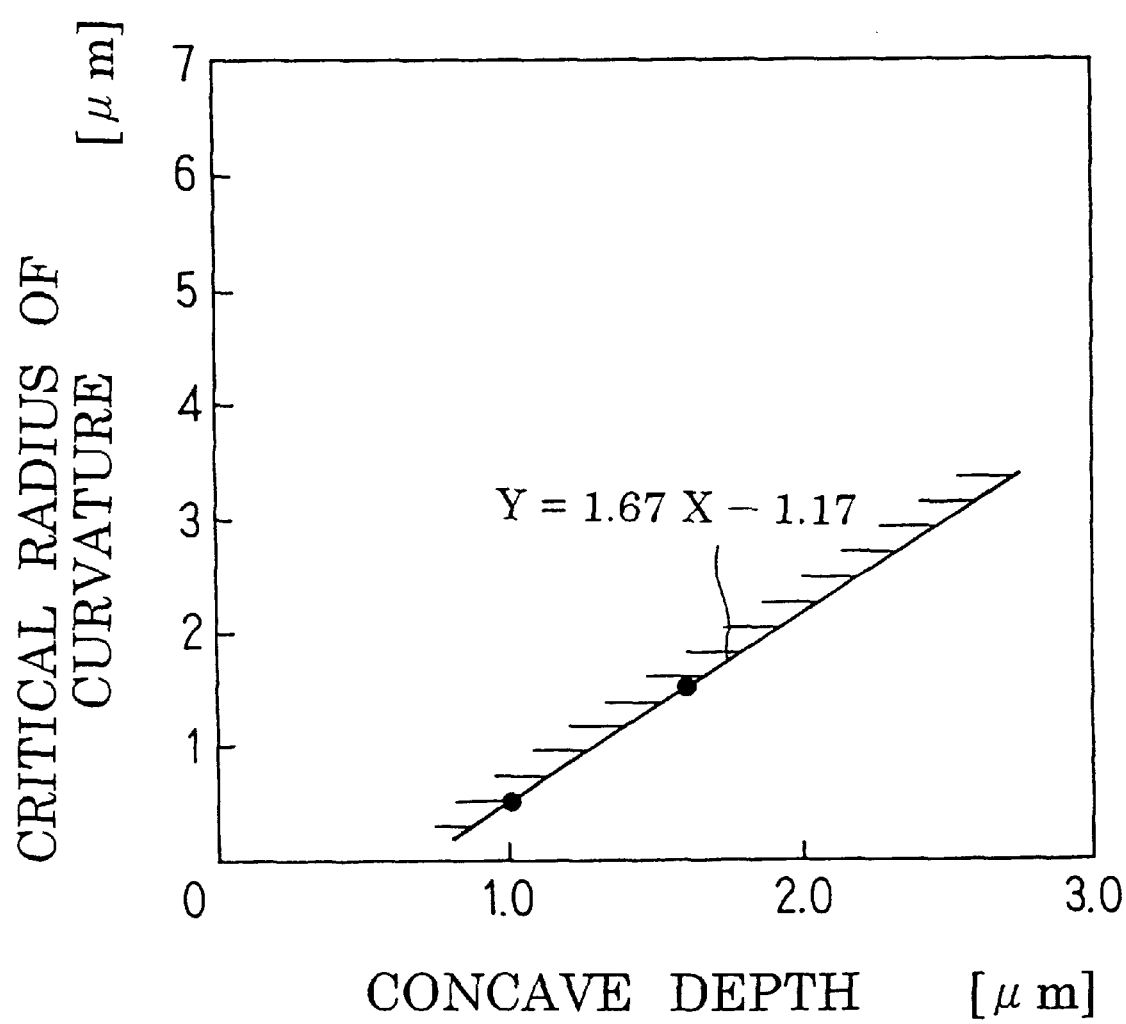
FIG. 25 is a graph illustrating the relationship between a concave depth of the groove and a corresponding critical radius of curvature at the groove corner.

The above-mentioned relationship can be explained as illustrated in FIG. 25. FIG. 25 shows the relationship between the concave depth X of U-groove 50 and the radius of curvature Y (critical radius of curvature) which can keep the gate-to-source breakdown voltage high level. According to FIG. 25, when the concave depth is X and the radius of curvature is Y, the high breakdown voltage can be maintained if the relationship of $Y \geq 1.67 - X - 1.17$ is satisfied.

Figure 26:
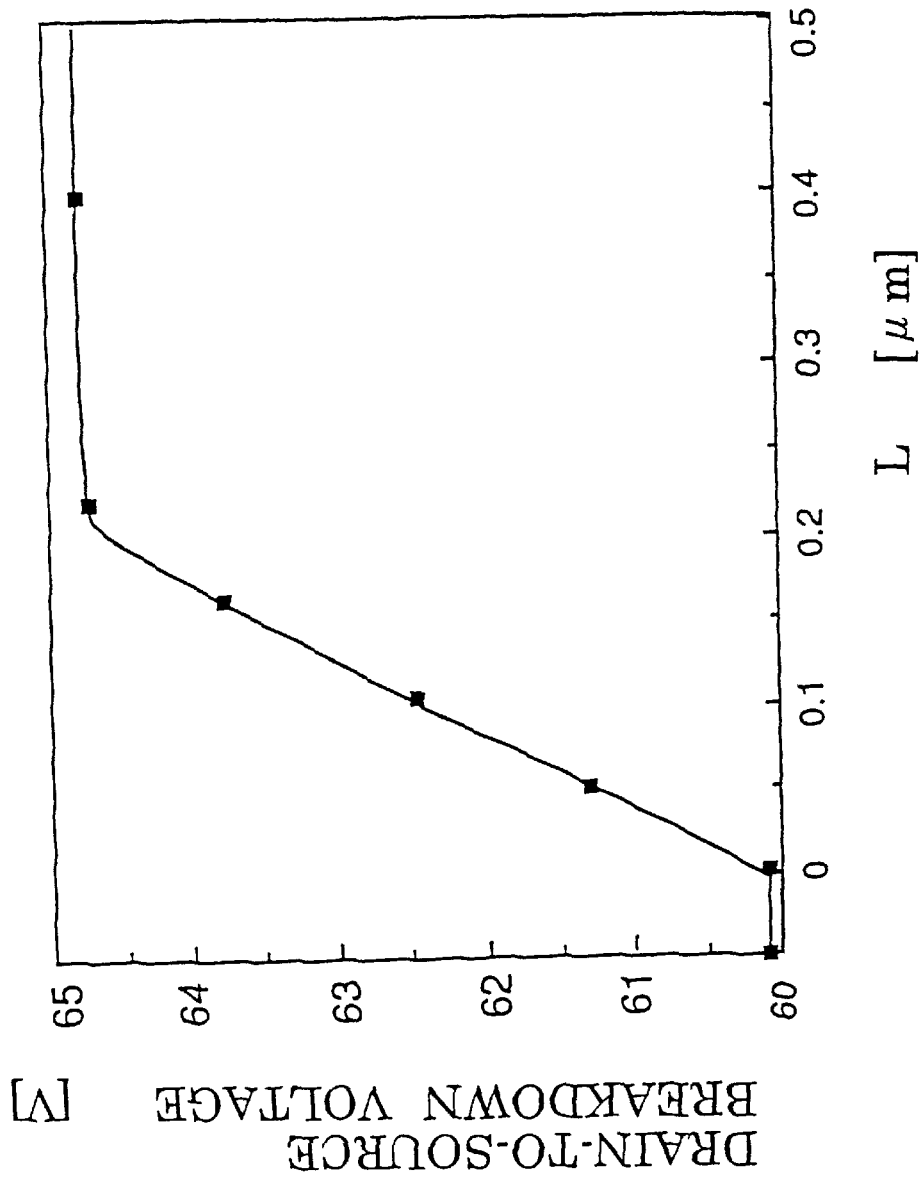
FIG. 26 is a graph illustrating the relationship between a drain-to-source breakdown voltage and a relative position L of a groove bottom and the channel well region.

Further, according to the present embodiment, the relationship between the concave depth of U-groove 50 and the junction depth of the channel p-well region is determined in association with the concave width (corresponding to the distance between the adjacent channel p-well regions) such that depletion layers extending from the adjacent channel p-well regions are connected to each other below the sandwiched U-groove at a drain voltage lower than the critical voltage that causes a breakdown of the pn-junction between the channel p-well region and the n⁻-type epitaxial layer near U-groove 50. Concretely, as illustrated in FIG. 17B, the interface 72 between the gate oxide film and the silicon surface at the bottom of U-groove 50 is disposed to be shallower than the junction depth (or the bottom 73) of the channel p-well region by, for example in this embodiment, at least 0.2 $\mu$m. Accordingly, when high voltage is applied to the drain electrode during the OFF state of the device, depletion layers can extend laterally from the p-type body regions disposed sandwiching the U-groove into the n⁻-type epitaxial layer 2 under the groove bottom portion so that the electric field intensity at the groove bottom portion can be decreased, with the result that the drain-to-source breakdown voltage can be improved. FIG. 26 shows a result measuring the relationship between a depth difference L (see FIG. 17B) from junction depth 73 (line L3) to the groove bottom interface 72 (line L2) and the obtained drain-to-source breakdown voltage of the actually manufactured vertical power MOSFET when the drain-to-source breakdown voltage of approximately 60 V is designed. The result indicates that with increasing the depth difference L the drain-to-source breakdown voltage is increased and the depth difference L is saturated at the point approximately 0.2 $\mu$m or more. This is because the adjacent depletion layers from the adjacent p-type body regions extend laterally and are connected to each other when the depth difference L becomes 0.2 $\mu$m or more. Consequently, a breakdown occurs at the deepest part of p-type diffusion layer (i.e., deep p-well region) 62, and furthermore, a hole current due to the occurrence of the breakdown near the U-groove is prevented from flowing through the part between p-type body region 16 and n⁺-type source region 4. In accordance with this, the parasitic bipolar transistor composed of n⁺-type source region 4, p-type body region 16 and n⁻-type drain region 6 is prevented from operating, and thus, the surge resistant quantity is increased.

Figure 27:
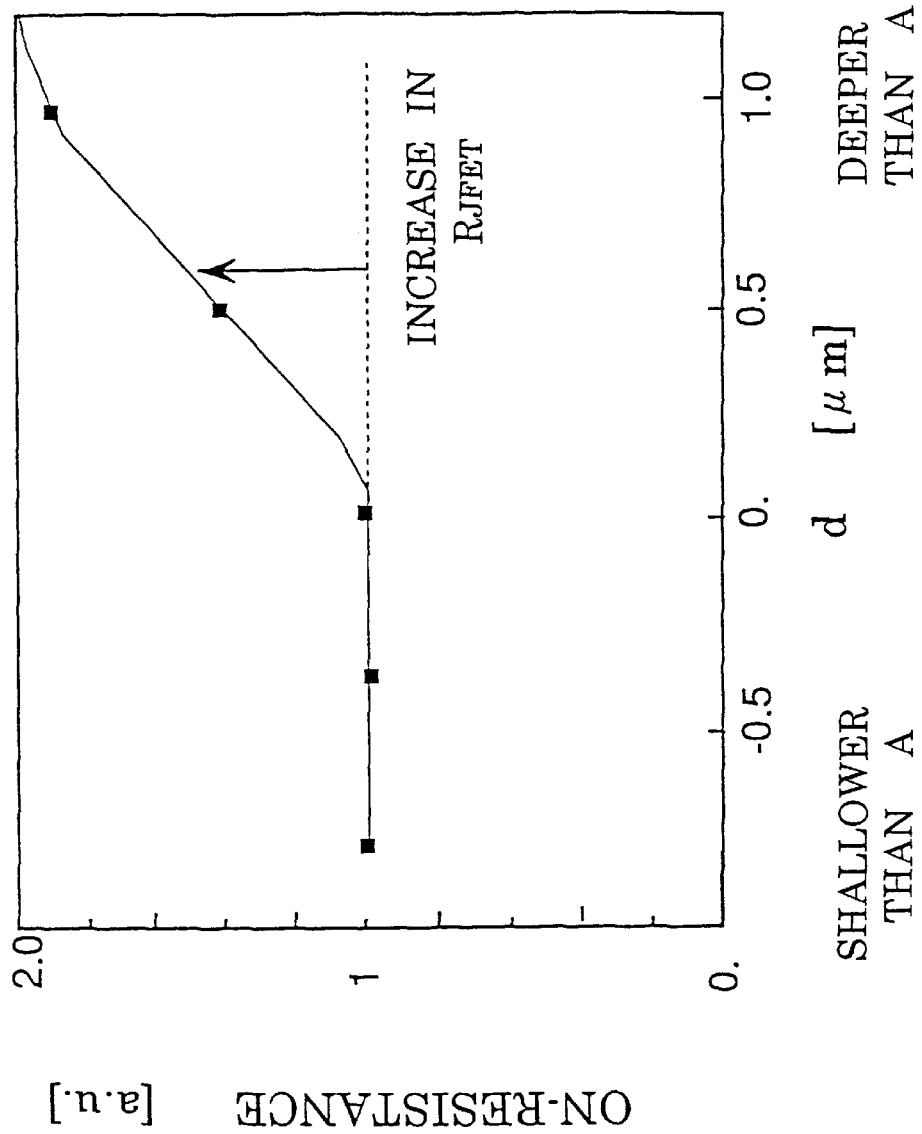
FIG. 27 is a graph illustrating the relationship between a position d where the channel well region and a gate oxide film contact with each other and a resultant ON-resistance.

Still further, as illustrated in FIG. 17B, the concave depth of the U-groove 50 and the profile of the body region are determined in such a manner that the point B, which corresponds to the intersection point A of the line L2 and the line L1 (tangential line to the sidewall interface 71), is located deeper than the point C where the p-type body region and the sidewall interface 71 are in contact with each other. Therefore, an electron current can flow substantially in a straight line from the drain side of the channel toward the substrate, and thus, low ON-resistance can be obtained without any increase in JFET resistance component. FIG. 27 shows the measuring results of the relationship between the ON-resistance and the relative position or the point C with respect to the point B in FIG. 17B. The relative position is represented by a distance d defined in FIG. 17B. According to the result, when the point C is deeper than the point A (or point B), the JFET resistance component is increased and the ON-resistance is suddenly increased. On the other hand, in case the point C is situated at the position shallower than the point A (or point B) as in the embodiment, low ON-resistance can be obtained.

From these experimental results shown in FIGS. 26 and 27, it is evident that a control of the relative positions among the U-groove bottom interface 72, the terminating point C where the pn-junction between the channel p-well region and the epitaxial layer terminates at the sidewall of the U-groove, and the bottom 73 of the channel p-well region is a technique essential for controlling the fundamental characteristics of the concave channel type DMOS structure, such as the drain-to-source breakdown voltage and the ON-resistance. In particular, according to the present embodiment, since the position of the interface 72 of the U-groove bottom is set by processes of chemical dry etching, LOCOS oxidation and gate oxidation, all of which are dry precesses, the controllability of the position of the interface 72 is extremely high, thereby controlling the above-mentioned relative positions among the groove bottom interface 72, the terminating position C and the bottom 73 of the channel p-well region with accuracy.

Hereinafter, a second embodiment of the present invention will be described with reference to the drawings.

Figure 6B:
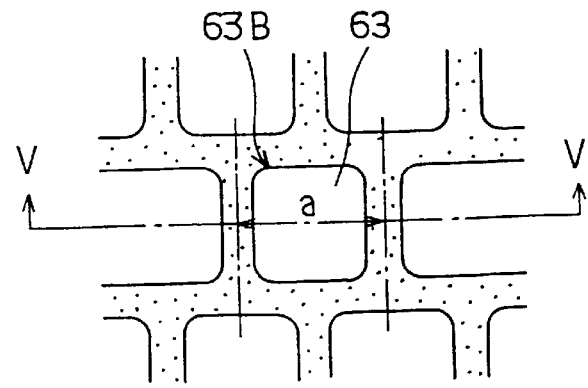

In the second embodiment, as illustrated in FIG. 6B, silicon nitride film 63, deposited on the main surface of wafer 21, is patterned with its corner portions 63B curved and the lattice-like plane pattern is modified into an alternately shifted pattern. Here, this alternately shifted pattern refers to a net pattern that the groove corner portion (63A in FIG. 6A) of the lattice-like plane pattern, in which the electric field is easily concentrated, is caused to be faced to a linear groove pattern (i.e., the region surrounded by the groove corner portions of the lattice-like pattern is shifted in a certain direction). This alternately shifted pattern of silicon nitride film 63 defines a plane pattern of the initial groove 64 by using the patterned silicon nitride film 63 as a mask in FIG. 7 and is ultimately reflected to a plane pattern for a square cell in the last process (illustrated in FIGS. 23A and 23B).

Figure 23A:
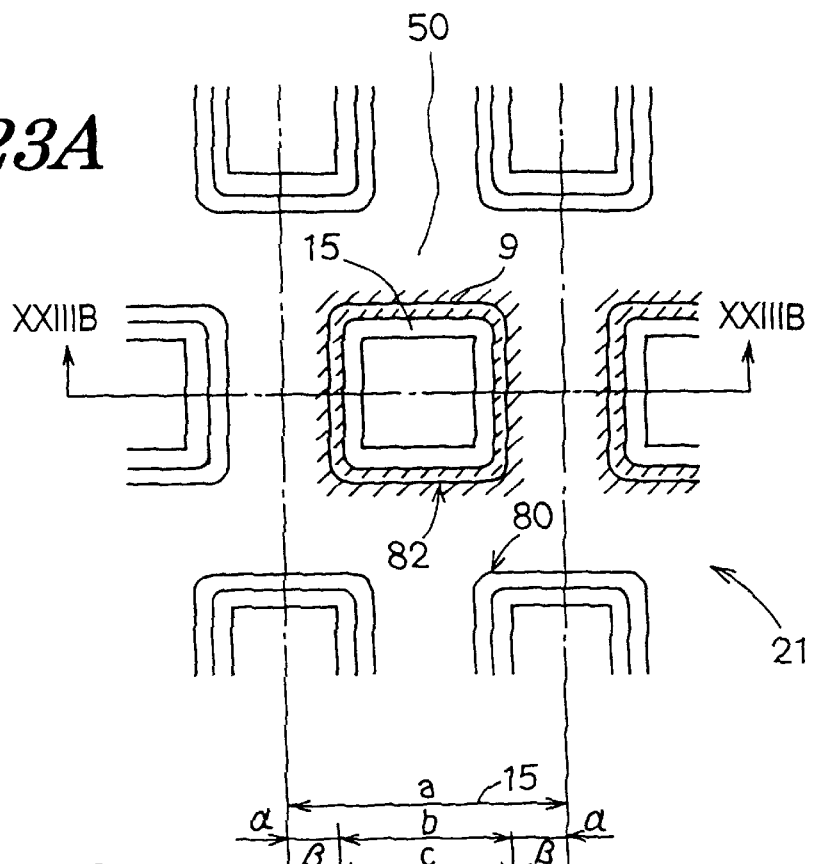
FIG. 23A is a plan view illustrating a part of a vertical type power MOSFET according to the second embodiment of the present invention and FIG. 23B is a cross-sectional view taken along line XXIIIB—XXIIIB of FIG. 23A.
Figure 23B:
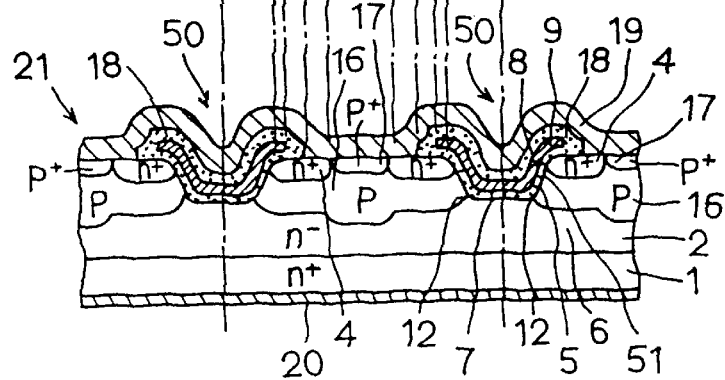

According to the orthogonal lattice-like groove pattern shown in FIGS. 22A and 22B and FIGS. 1A and 1B, although in the first embodiment the relationship between the concave dimension of U-groove 50 and the profile of the channel p-well region is determined to relax the electric field beneath U-groove 50, the electric field is still easily concentrated at a region 81 where the groove width (concave width) becomes maximum. However, by using the pattern that groove corner 80 is faced to the linear groove pattern portion 82 as illustrated in FIGS. 23A and 23B, the maximum groove width can be smaller and there can be obtained the field relaxation at the three-dimensionally projecting portion of the groove corner in a lattice-like pattern (the three-dimensionally sharpened portion) when voltage is applied between the drain electrode and the source electrode, thereby, controlling occurrence of poor drain-to-source breakdown voltage.

The above mentioned first and second embodiments are described using a vertical power MOSFET structure described in International Publication No. PCT WO93/03502. However, the present invention should not be limited only to a vertical power MOSFET in which p-type body region and n⁺-type source region are self-alignedly ion-implanted and double-diffused using the LOCOS oxide film, but the present invention is applicable to a vertical power MOSFET in which a p-type body region and an n⁺-type source region are ion-implanted using a photoresist mask and diffused, for example.

Furthermore, the present invention is not limited to the vertical type MOSFET, but may be applied to other gate construction such as a power MOS-IC with an incorporation of the MOSFET referred to in the above and an IGBT (insulated gate bipolar transistor). Further, the present invention may also be applied to lateral type power MOSFET and an IGBT.

In addition, in the above embodiments, description has been given only to the n-channel type, it is needless to say that the p-channel type can have the same effect as the n-channel type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor substrate having a main surface and a rear surface opposite to said main surface;
   a semiconductor layer of a first conductivity type disposed on said main surface of said semiconductor substrate, having an impurity concentration lower than said semiconductor substrate, and having a concave portion on a surface thereof;
   a body region of a second conductivity type disposed in such a manner that a an junction defined with said semiconductor layer is terminated at a sidewall of said concave portion;
   a source region of said first conductivity type disposed in said body region to define a channel region at said sidewall of said concave portion;
   a gate insulating film disposed to cover at least said channel region; and
   a gate electrode disposed in correspondence with said channel region with said gate insulating film interposed therebetween,
   wherein a planar shape of said concave portion relative to said surface of said semiconductor layer has a curvilinear corner portion.

2. A semiconductor device according to claim 1, wherein:
   said semiconductor layer has a plurality of concave portions which have a planar layout pattern being reticular relative to said surface of said semiconductor layer, said planar layout pattern including a plurality of regions corresponding to said plurality of concave portions; and
   one of said plurality of regions corresponding to one of said plurality of concave portions has a corner portion having a specific curvature.

3. A semiconductor device according to claim 1, wherein said body region is a composite well region made up of a channel well region and a deep well region, said channel well region enveloping said source region and said channel region, and said deep well region being situated at a center of said channel well region and having a junction depth deeper than a junction depth of said channel well region.

4. A semiconductor device according to claim 1, further comprising a source electrode contacting at least said source region, and a drain electrode contacting said rear surface of said semiconductor substrate.

5. A semiconductor device according to claim 1, wherein said semiconductor substrate is composed of silicon and said main surface thereof is oriented in a (1 0 0) plane.

6. A semiconductor device according to claim 2, wherein said planar layout pattern of said plurality of concave portions is a pattern wherein said corner portion of said one of said plurality of regions faces a linear portion of adjacent one of said plurality of regions.

7. A semiconductor device according to claim 2, wherein a relationship of $Y \geq 1.67X - 1.17$ is satisfied when a radius of curvature at said corner portion is Y and a concave depth of said one of said plurality of concave portions is X.

8. A semiconductor device according to claim 3, wherein said junction depth of said channel well region is controlled to be deeper than a bottom of said concave portion while said pn junction defined between said body region and said semiconductor layer is terminated at said sidewall of said concave portion.

9. A semiconductor device according to claim 3, wherein a geometry of said concave portion is selected in association with a profile of said channel well region such that each depletion layer extending from a corresponding pn junction defined between a corresponding channel well region and said semiconductor layer is mutually connected under said concave portion prior to an occurrence of a breakdown of said corresponding pn junction while preventing an increase in JFET resistance component.

10. A semiconductor device according to claim 5, wherein an elevation angle of said sidewall of said concave portion with respect to said main surface of said semiconductor substrate is selected such that said sidewall of said concave portion is substantially oriented in a (1 1 1) plane.

11. A semiconductor device according to claim 8, wherein said junction depth of said channel well region is controlled to be 0.2 $\mu$m or more deeper than said bottom of said concave portion.

* * * * *